US010542647B2

(12) United States Patent
Chan

(10) Patent No.: US 10,542,647 B2
(45) Date of Patent: Jan. 21, 2020

(54) ELECTRONIC DEVICE AND BELT-SHAPED COVER THEREOF

(71) Applicant: ASUSTEK COMPUTER INC., Taipei (TW)

(72) Inventor: Wai-Tong Chan, Taipei (TW)

(73) Assignee: ASUSTEK COMPUTER INC., Taipei (TW)

(*) Notice: Subject to any disclaimer, the term of this patent is extended or adjusted under 35 U.S.C. 154(b) by 0 days.

(21) Appl. No.: 16/031,388

(22) Filed: Jul. 10, 2018

(65) Prior Publication Data

US 2019/0021192 A1 Jan. 17, 2019

Related U.S. Application Data

(60) Provisional application No. 62/530,855, filed on Jul. 11, 2017.

(30) Foreign Application Priority Data

May 29, 2018 (CN) .......................... 2018 1 0534244

(51) Int. Cl.

*H05K 9/00* (2006.01)
*H05K 5/03* (2006.01)
*G06F 1/16* (2006.01)
*H04M 1/02* (2006.01)

(52) U.S. Cl.

CPC ......... *H05K 9/0081* (2013.01); *G06F 1/1613* (2013.01); *G06F 1/1616* (2013.01); *G06F 1/1679* (2013.01); *G06F 1/1683* (2013.01); *H04M 1/0249* (2013.01);

(Continued)

(58) Field of Classification Search

CPC ...... H05K 9/0081; H05K 5/03; H05K 9/0054; H05K 9/0007

See application file for complete search history.

(56) References Cited

U.S. PATENT DOCUMENTS 9,497,697 B2 11/2016 Becze et al.
2007/0279852 A1 12/2007 Daniel et al.

(Continued)

FOREIGN PATENT DOCUMENTS

CN 203733183 U 7/2014
CN 204360296 U 5/2015

(Continued)

OTHER PUBLICATIONS

Intellectual Property Office of the Republic of China, Office Action, dated Mar. 5, 2019, 3 pages.

*Primary Examiner* — Hoa C Nguyen
*Assistant Examiner* — Keith DePew
(74) *Attorney, Agent, or Firm* — Muncy, Geissler, Olds & Lowe, P.C.

(57) ABSTRACT

A belt-shaped cover adapted to an electronic device is provided. The electronic device includes a first part and a second part. The second part is movably connected to the first part, and an opening is adjustably formed between the first part and the second part. The belt-shaped cover includes an adjustable belt and a sensing element. The adjustable belt connects the first part and the second part to adjust the size of the opening. The sensing element is disposed on the adjustable belt to sense a connecting mode of the adjustable belt.

10 Claims, 10 Drawing Sheets

100 120 150 140 160 162b 160b 160a 161

(52) U.S. Cl.
CPC ............ *H04M 1/0256* (2013.01); *H05K 5/03* (2013.01); *H05K 9/0007* (2013.01); *H05K 9/0054* (2013.01)

(56) References Cited

U.S. PATENT DOCUMENTS

| | | | | |
|---|---|---|---|---|
| 2014/0104180 | A1* | 4/2014 | Schaffer | G06F 3/02 345/169 |
| 2014/0180365 | A1* | 6/2014 | Perryman | H01C 21/40 607/60 |
| 2016/0007697 | A1* | 1/2016 | de Jong | A44C 5/2071 361/679.03 |
| 2016/0259514 | A1 | 9/2016 | Sang et al. | |
| 2016/0363957 | A1* | 12/2016 | Stroetmann | G06F 1/163 |
| 2017/0055881 | A1* | 3/2017 | Kang | A61B 5/002 |
| 2018/0249133 | A1* | 8/2018 | Thiel | H04N 7/185 |
| 2018/0264318 | A1* | 9/2018 | Fung | A63F 13/65 |
| 2018/0348823 | A1* | 12/2018 | Kong | H05K 3/284 |
| 2019/0033043 | A1* | 1/2019 | Piccioni | F41H 13/00 |

FOREIGN PATENT DOCUMENTS

| | | | |
|---|---|---|---|
| CN | 105549705 | A | 5/2016 |
| CN | 105639811 | A | 6/2016 |
| CN | 105889721 | A | 8/2016 |
| CN | 105892973 | A | 8/2016 |
| CN | 205864959 | U | 1/2017 |
| TW | 200901906 | A | 1/2009 |
| TW | M456735 | | 7/2013 |
| TW | M491451 | U | 12/2014 |

* cited by examiner

ELECTRONIC DEVICE AND BELT-SHAPED COVER THEREOF

CROSS-REFERENCE TO RELATED APPLICATION

This application claims the priority benefit of U.S. provisional application Ser. No. 62/530,855, filed on Jul. 11, 2017, and CN Patent Application No. 201810534244.6 filed on May 29, 2018. The entirety of the above-mentioned patent application is hereby incorporated by reference herein and made a part of the specification.

BACKGROUND OF THE INVENTION

Field of the Invention

The invention relates to an electronic device and a cover thereof.

Description of the Related Art

Due to compliant the specification of electromagnetic shielding (EMI) and safety, the design of thermal vias and the choice of material for the housing of the electronic device are generally limited. For example, a metal housing of the electronic device is not suitable to have large sizes of heat dissipation holes. And the appearance of the electronic device is considerably limited.

BRIEF SUMMARY OF THE INVENTION

An electronic device and a cover thereof are provided. Except for electromagnetic shielding effect, the cover of the electronic device is able to be adjusted according to the user's requirements, which provide varies using modes.

A belt-shaped cover adapted to an electronic device is provided. The electronic device includes a first part and a second part. The second part is movably connected to the first part, and an opening is adjustably formed between the first part and the second part. The belt-shaped cover comprises an adjustable belt and a sensing element. The adjustable belt connects the first part and the second part to adjust the size of the opening. The sensing element is disposed on the adjustable belt to sense a connecting mode of the adjustable belt.

An electronic device is provided. The electronic device comprises a first part; a second part, and an adjustable belt. The second part is movably connected to the first part, and an opening is adjustably formed between the first part and the second part. The adjustable belt connects the first part and the second part to adjust a size of the opening.

The electronic device and the belt-shaped cover provide electromagnetic shielding effect. The adjustable belt is used to adjust the size of the opening of the electronic device according to the user's requirements, so as to match different using modes, and improve user's operating experience.

These and other features, aspects and advantages of the present invention will become better understood with regard to the following description, appended claims, and accompanying drawings.

DETAILED DESCRIPTION OF THE EMBODIMENTS

Figure 1A:
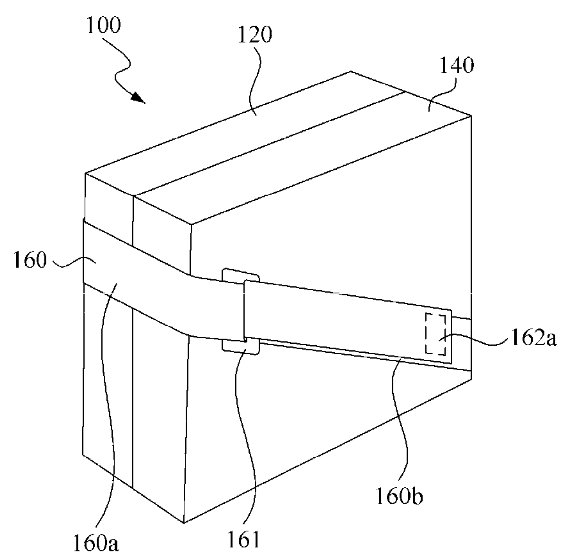
FIG. 1A to FIG. 1C are schematic diagrams of three connecting modes of an adjustable belt of an electronic device in an embodiment.
Figure 1B:
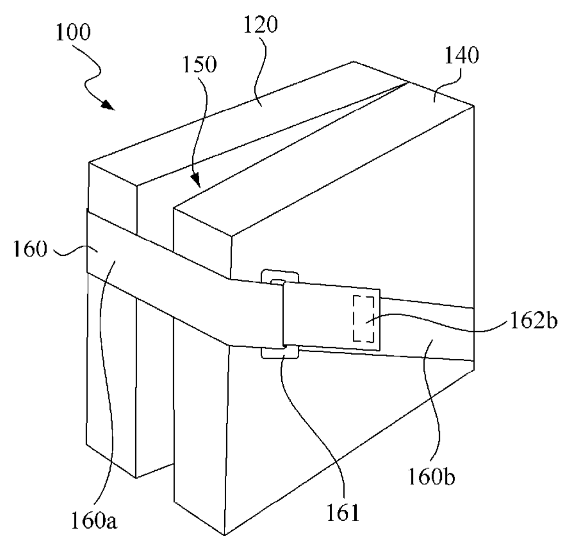
Figure 1C:
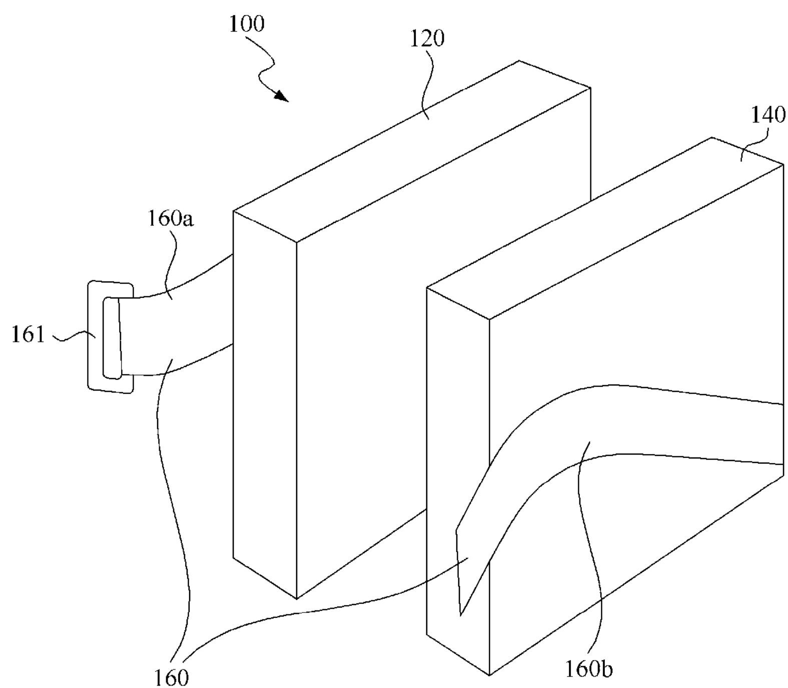

FIG. 1A to FIG. 1C are schematic diagrams of three connecting modes of an adjustable belt of an electronic device in an embodiment. The electronic device is a desktop computer, a notebook computer, a tablet computer, a router, a motherboard, or a display card.

The electronic device 100 includes a first part 120 and a second part 140. The second part 140 is movably connected to the first part 120, the first part 120 and the second part 140 is adjustable to form an opening 150. The belt-shaped cover includes an adjustable belt and at least one sensing element 162*a*, 162*b*. Two ends of the adjustable belt 160 are respectively fixed to the first part 120 and the second part 140 to adjust the size of the opening 150. In an embodiment, the adjustable belt 160 includes a first fixing belt 160*a*, a second fixing belt 160*b*, and a buckle 161.

The fixing belts 160*a*, 160*b* are respectively fixed to the first part 120 and the second part 140. The buckle 161 is disposed at the end of the first fixing belt 160*a*, and the end of the second belt 160*b* passes through the buckle 161 and then is fastened to the second belt 160*b*. By adjusting the fastening position of the end of the second belt 160*b* on the second belt 160*b*, the length of the adjustable belt 160 is adjusted, and further to adjust the size of the opening 150. In another embodiment, the adjustable belt 160 uses the reel to adjust the length. See FIG. 4 for details.

In an embodiment, the adjustable belt 160 provides electromagnetic shielding effect. For example, the adjustable belt 160 is made of an electromagnetic shielding material, such as a textile material mixed with metal wires. In an embodiment, the adjustable belt 160 is made of elastic material with metal.

The adjustable belt 160 includes multiple connecting modes. As shown in FIG. 1A, in a first connecting mode, the adjustable belt 160 is fully tightened, and the first part 120 abuts on the second part 140 to provide a better electromagnetic shielding effect.

As shown in FIG. 1B, in a second connecting mode, the first part 120 and the second part 140 are separated by adjusting the adjustable belt 160, and an uncovered opening 150 is formed between the first part 120 and the second part 140 of the electronic device 100 as a heat dissipating hole of the electronic device 100 to allow air convection inside and outside the electronic device to enhance heat dissipation.

As shown in FIG. 1C, in a third connecting mode, the adjustable belt 160 is completely disengaged, and the first part 120 and the second part 140 of the electronic device 100 are completely separated to facilitate user's inspection or maintenance of the electronic device.

The adjustment state of the adjustable belt is detected to transmit signals to the electronic device 100 to perform corresponding functions. Please refer to FIG. 2A and FIG. 2B, in an embodiment, the belt-shaped cover includes a plurality of sensing elements 162*a*, 162*b* disposed on different positions of the adjustable belt 160. In the embodiment, the number of the sensing elements 162*a*, 162*b* is two, and the sensing elements 162*a*, 162*b* are corresponding to the connecting modes in FIG. 1A and FIG. 1B respectively. According to practical use requirements, a greater number of the sensing elements are provided on the adjustable belt 160 to determine the size of the opening 150.

Figure 2A:
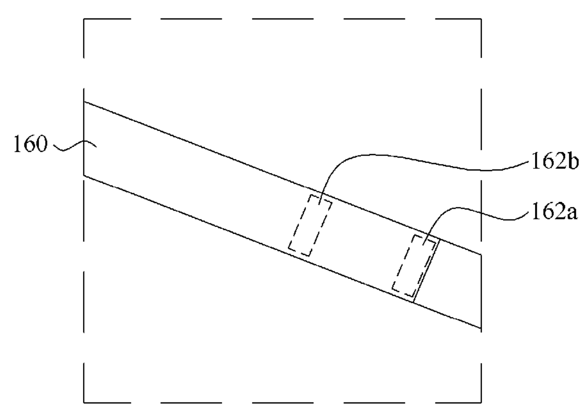
FIG. 2A to FIG. 2B are schematic diagrams of a sensing element of an adjustable belt in an embodiment.

As shown in FIG. 2A, when the adjustable belt 160 is engaged at the position of the sensing element 162*a* (corresponding to the connecting mode of FIG. 1A), the sensing element 162*a* transmits a signal to the electronic device 100, and then the electronic device 100 is switched to a normal operation mode.

Figure 2B:
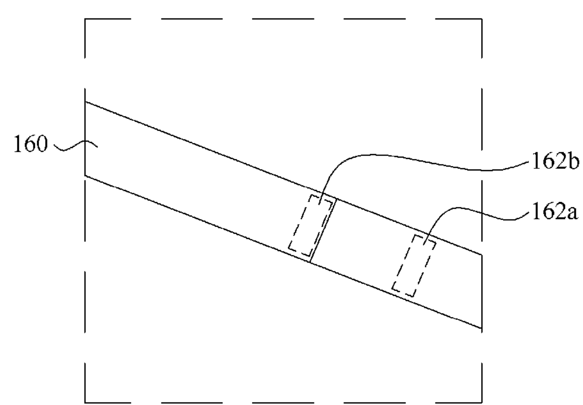

As shown in FIG. 2B, when the adjustable belt 160 is engaged at the position of the sensing element 162*b* (corresponding to the connecting mode of FIG. 1B), the sensing element 162*b* transmits a signal to the electronic device 100, and then the electronic device 100 is switched to an overclocking mode.

The opening 150 of the electronic device 100 is adjusted according to user's requirements. In an embodiment, in the normal operation mode, such as word processing or website browsing mode, the adjustable belt 160 is engaged at the position of the sensing element 162*a*. In this state, the first part 120 of the housing abuts against the second part 140. In an overclocking mode requiring a better heat dissipation effect, the adjustable belt 160 is moderately loosed and engaged at the position of the sensing element 162*b* to form the opening 150 for heat dissipation.

In an embodiment, if the electronic device 100 initially receives a signal from the sensing element 162*a* and then receives a signal from the sensing element 162*b*, the operation of the electronic device 100 is switched from the normal operation mode to the overclocking mode.

In an embodiment, the electronic device 100 is able to be detached into two separate parts 120 and 140, such as a tablet computer and a dock. If the electronic device (the tablet computer or the dock) does not receive a signal from the sensing element 162*a* or 162*b*, it means that the two independent parts 120, 140 are not connected. At this time, the two independent parts 120, 140 operate individually. If the tablet or the dock receives a signal from the sensing element 162*a* or 162*b*, it means that the two independent parts 120, 140 are connected, and the two independent parts 120, 140 are coupled to each other as one electronic device to operate.

In one embodiment, the sensing elements 162*a*, 162*b* are a pressure sensitive element, a photosensitive element, a temperature sensing element, or a wireless communication element, such as a Near Field Communication (NFC) element or a Bluetooth element, which is not limited herein.

In addition to the foregoing connecting modes of FIG. 1A to FIG. 1C, the adjustable belt 160 also provides other functions to facilitate user's use.

Figure 3A:
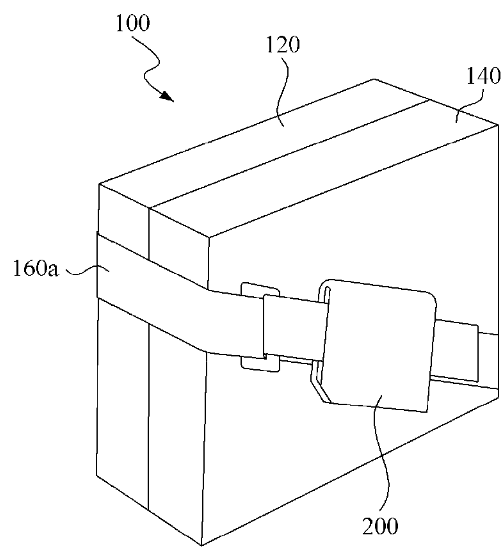
FIG. 3A to FIG. 3D are schematic diagrams of four different modes of use of an adjustable belt in an embodiment.
Figure 3B:
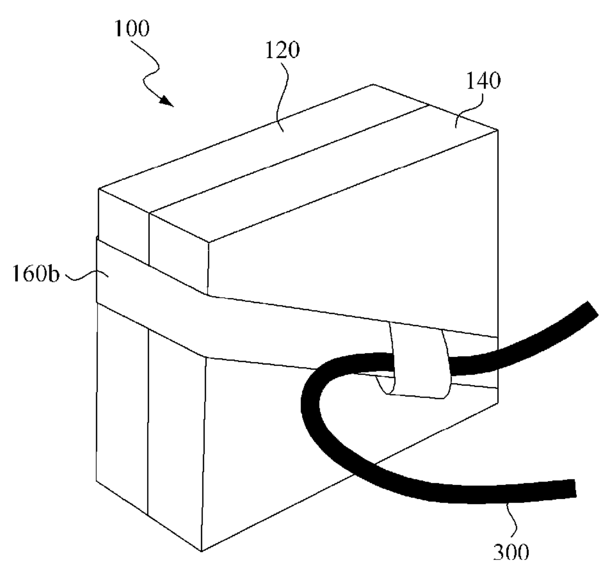
Figure 3C:
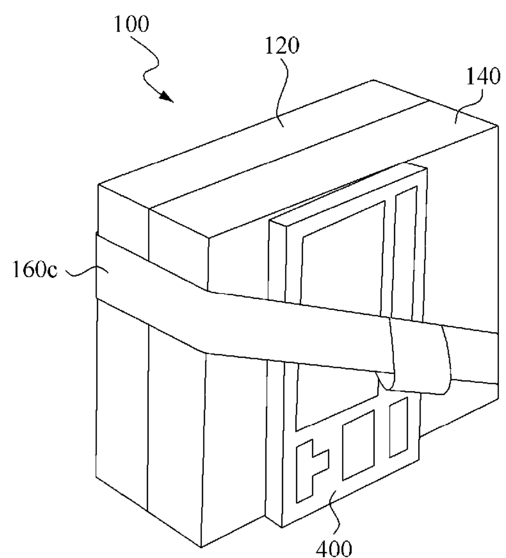
Figure 3D:
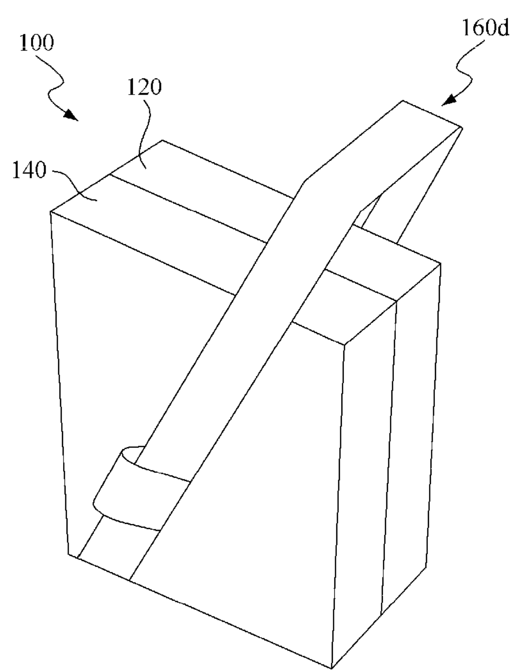

As shown in FIG. 3A to FIG. 3C, the adjustable belts 160*a*, 160*b*, 160*c* are able to be used as a hanger for fixing a wallet 200, a connecting cable 300, a mouse, a controller 400, or other computer peripheral equipment. As shown in FIG. 3D, the adjustable belt 160*d* can also be used as a strap of the electronic device 100, which is convenient for the user to carry.

Figure 4:
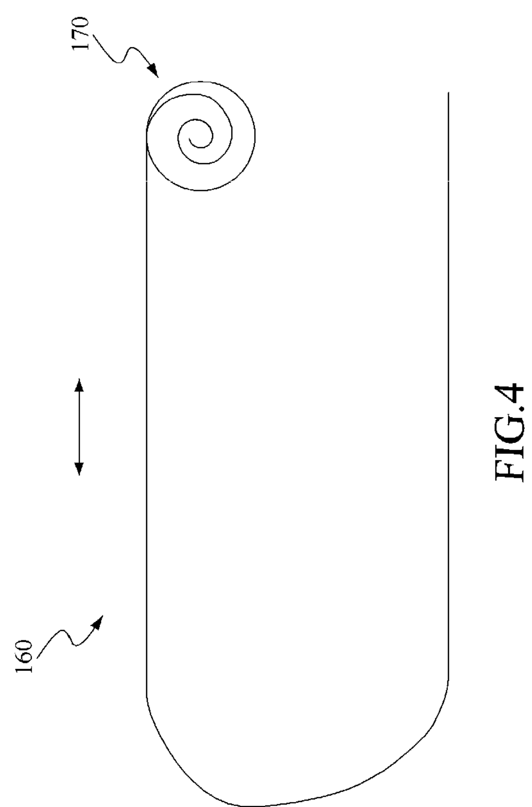
FIG. 4 is a schematic diagram of an adjustable belt for an electronic device in another embodiment.

As shown in FIG. 4, in an embodiment, the electronic device 100 is provided with a reel 170 on its housing. One end of the adjustable belt 160 is connected to the reel 170. The reel 170 is used to adjust the length of the adjustable belt 160 to match the various different usages.

The electronic device and the belt-shaped cover provided have electromagnetic shielding effect, and the adjustable belt is used to adjust the size of the opening of the electronic device according to the user's requirements, so as to match different using modes, and improve user's operating experience.

Although the present invention has been described in considerable detail with reference to certain preferred embodiments thereof, the disclosure is not for limiting the scope of the invention. Persons having ordinary skill in the art may make various modifications and changes without departing from the scope. Therefore, the scope of the appended claims should not be limited to the description of the preferred embodiments described above.

What is claimed is:

1. A belt-shaped cover, adapted to an electronic device, the electronic device includes a first part housing and a second part housing, the second part housing is movably connected to the first part housing, and an opening is adjustably formed between the first part housing and the second part housing, and the belt-shaped cover comprising:

an adjustable belt, for connecting the first part housing and the second part housing to adjust the size of the opening; and a sensing element, disposed on the adjustable belt to sense a connecting mode of the adjustable belt.

2. The belt-shaped cover according to claim 1, wherein the adjustable belt provides electromagnetic shielding effect.

3. The belt-shaped cover according to claim 1, wherein the sensing element transmits a signal to the electronic device according to the connecting mode of the adjustable belt.

4. The belt-shaped cover according to claim 1, further comprising a reel, connecting to an end of the adjustable belt to adjust the length of the adjustable belt.

5. An electronic device, comprising:

a first part housing;

a second part housing, movably connected to the first part housing, and an opening adjustably formed between the first part housing and the second part housing; and an adjustable belt, connecting the first part housing and the second part housing to adjust a size of the opening.

6. The electronic device according to claim 5, further comprising a sensing element, disposed on the adjustable belt to sense a connecting mode of the adjustable belt.

7. The electronic device according to claim 6, wherein the sensing element transmits a signal to the electronic device according to the connecting mode of the adjustable belt.

8. The electronic device according to claim 7, wherein, the electronic device is switched between a normal operation mode and an overclocking mode according to the signal.

9. The electronic device according to claim 5, wherein the adjustable belt provides electromagnetic shielding effect.

10. The electronic device according to claim 5, further comprising a reel, connecting to an end of the adjustable belt to adjust the length of the adjustable belt.

* * * * *